(12) United States Patent
Kaneko et al.

(10) Patent No.: US 9,330,774 B2
(45) Date of Patent: May 3, 2016

(54) SEMICONDUCTOR MEMORY DEVICE

(71) Applicant: KABUSHIKI KAISHA TOSHIBA, Tokyo (JP)

(72) Inventors: Mizuki Kaneko, Yokohama Kanagawa (JP); Junji Musha, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/469,514

(22) Filed: Aug. 26, 2014

(65) Prior Publication Data

US 2015/0262687 A1    Sep. 17, 2015

(30) Foreign Application Priority Data

Mar. 14, 2014  (JP) .................................. 2014-051850

(51) Int. Cl.
*G11C 16/06* (2006.01)
*G11C 16/24* (2006.01)
*G11C 16/32* (2006.01)

(52) U.S. Cl.
CPC ................ *G11C 16/24* (2013.01); *G11C 16/32* (2013.01)

(58) Field of Classification Search
CPC .... G11C 16/30; G11C 11/5628; G11C 16/10; G11C 16/12; G11C 16/3459; G11C 29/789; G11C 5/143; G11C 5/145; G11C 11/4074; G11C 11/4094; G11C 16/0483; G11C 16/08; G11C 16/105; G11C 16/20
USPC .................. 365/185.18, 189.11, 226, 185.11, 365/185.17, 229, 230.06
See application file for complete search history.

(56) References Cited

U.S. PATENT DOCUMENTS 6,041,012 A * 3/2000 Banba ..................... G11C 5/143
                                                        365/185.18
2007/0211502 A1  9/2007 Komiya

FOREIGN PATENT DOCUMENTS

JP  2004005773 A   1/2004
JP  2007336722 A   12/2007

* cited by examiner

*Primary Examiner* — Thong Q Le
(74) *Attorney, Agent, or Firm* — Patterson & Sheridan, LLP

(57) ABSTRACT

A semiconductor memory device includes a memory cell array, a voltage generation circuit that generates a voltage applied to the memory cell array, the voltage generation circuit including a plurality of boosting circuits connected in series between an input terminal and an output terminal, and a switching circuit configured to short-circuit one or more of the boosting circuits to the input terminal, and a control circuit that controls a conduction state of the switching circuit to vary the number of boosting circuits that are driven to generate the voltage applied to the memory cell array.

20 Claims, 18 Drawing Sheets

("0" Write Operation)

(Read Operation)

(Erase Operation)

SEMICONDUCTOR MEMORY DEVICE

CROSS-REFERENCE TO RELATED APPLICATION

This application is based upon and claims the benefit of priority from Japanese Patent Application No. 2014-051850, filed Mar. 14, 2014, the entire contents of which are incorporated herein by reference.

FIELD

Embodiments described herein relate generally to a semiconductor memory device.

BACKGROUND

In a semiconductor memory device such as a NAND-type flash memory, a boosting circuit generates voltages of various levels according to operation types. In general, a nonvolatile semiconductor memory device is provided with boosting circuits in a plurality of stages, and the boosting circuits of the required number of stages are selectively driven according to a required voltage level.

Recently, there has been a demand for lower power consumption and lower current consumption in the semiconductor memory device. On the one hand, current consumption in the semiconductor memory device is increasing according to progress of making the semiconductor memory device highly dense and miniaturized. In such a situation, it is important to reduce a peak current in the semiconductor memory device. In the boosting circuit, it is also important to reduce such a peak current.

DETAILED DESCRIPTION

A semiconductor memory device according to the embodiments allows a peak current of a boosting circuit to be reduced.

In general, according to one embodiment, a semiconductor memory device includes a memory cell array, a voltage generation circuit that generates a voltage applied to the memory cell array, the voltage generation circuit including a plurality of boosting circuits connected in series between an input terminal and an output terminal, and a switching circuit configured to short-circuit one or more of the boosting circuits to the input terminal, and a control circuit that controls a conduction state of the switching circuit to vary the number of boosting circuits that are driven to generate the voltage applied to the memory cell array.

Next, a semiconductor memory device according to an embodiment will be described in detail with reference to the drawings.

Figure 1:
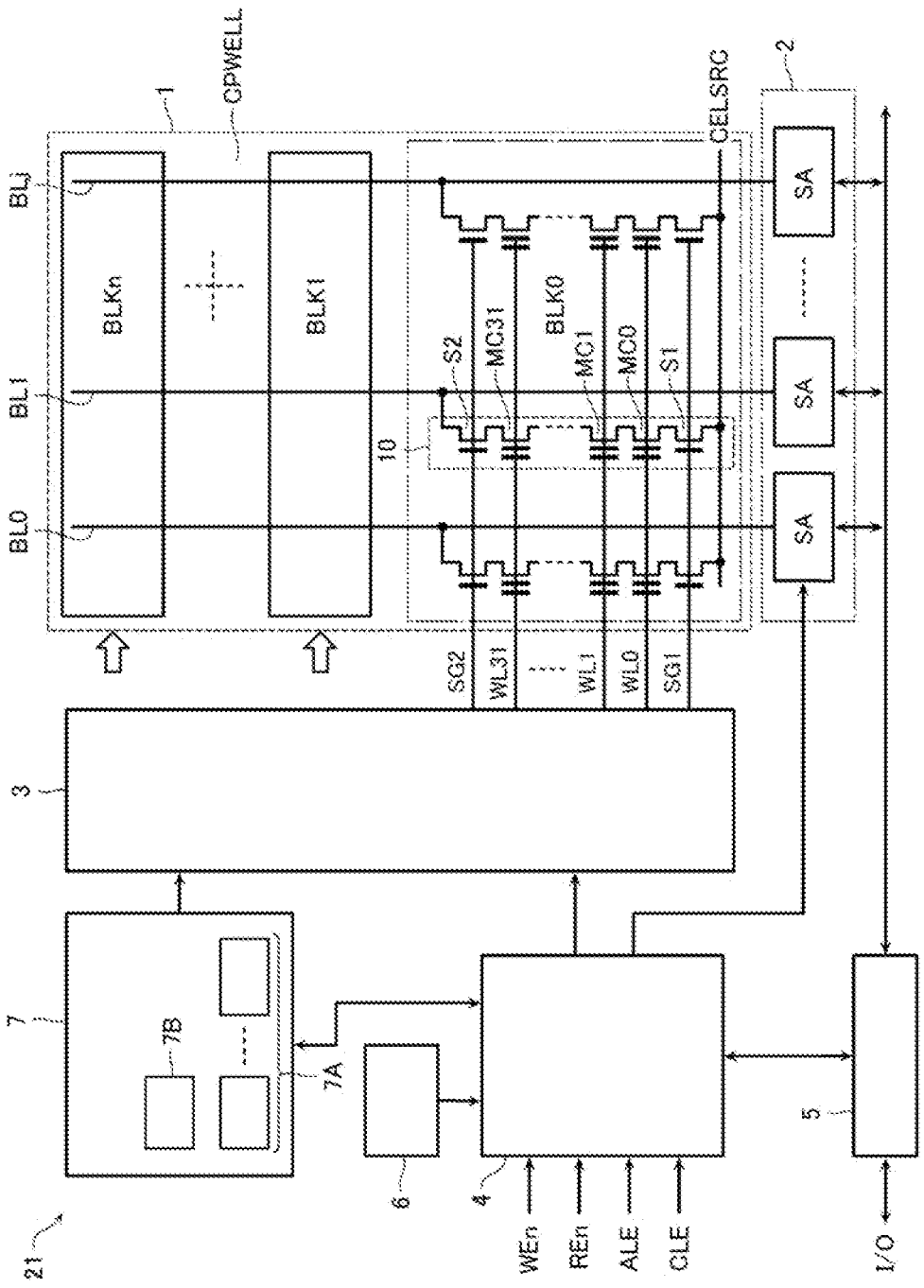
FIG. 1 is a schematic diagram illustrating a configuration of a semiconductor memory device according to an embodiment.

FIG. 1 is a schematic diagram illustrating a configuration of a semiconductor memory device according to an embodiment. In the following description, a NAND-type flash memory will be described as an example of the semiconductor memory device. However, a voltage generation circuit according to the embodiment is not limited to the NAND-type flash memory, and it should be understood that the voltage generation circuit may be used in various semiconductor memory devices.

As illustrated in FIG. 1, the NAND-type flash memory includes a memory cell array 1, a sense amplifier circuit 2, a row decoder 3, a controller 4, an input/output buffer 5, a ROM fuse 6, and a voltage generation circuit 7. The controller 4 operates as a control unit for the memory cell array 1. The memory cell array 1 includes NAND cell units 10 which are arranged in a matrix. One of the NAND cell units 10 includes a plurality of memory cells MC (MC0, MC1, ..., MC31) which are connected in series, and selective gate transistors S1 and S2 which are connected to both ends of the NAND cell unit 10. Although it is not illustrated in the drawings, one memory cell MC may include a stacked gate-type configuration. That is, the memory cell MC includes a floating gate electrode as a charge storage layer which is formed on a gate insulating film (a tunnel insulating film) formed between a drain and a source, and a control gate electrode which is formed on the floating gate electrode through an inter-gate insulating film. The control gate electrode of the memory cell MC in the NAND cell unit 10 is connected to word lines WL (WL0, WL1, ..., WL31) which are different from each other.

The source of the selective gate transistor S1 is connected to a common source line CELSRC, and the drain of the selective gate transistor S2 is connected to a bit line BL. The gate electrodes of the selective gate transistors S1 and S2 are connected to selective gate lines SG1 and SG2 which are in parallel with the word lines WL, respectively. A set of memory cells MC which share one word line WL constitutes one page or a plurality of pages. When the memory cell MC stores multi-valued data, or when control is performed by switching between an even-numbered bit line and an odd-numbered bit line, the set of the memory cells MC which share the one word line WL may constitute a plurality of pages equal to 2 or more pages.

As illustrated in FIG. 1, a set of a plurality of NAND cell units 10 which shares the word line WL and the selective gate lines SG1 and SG2 constitutes a block BLK which is a unit of erasing data. The memory cell array 1 is provided with a plurality of blocks BLK (BLK0, BLK1, . . . , BLKn) in a direction of the bit line BL. The memory cell array 1 including the plurality of blocks is formed in one cell well (CPWELL) of a silicon substrate.

The bit line BL of the memory cell array 1 is connected to the sense amplifier circuit 2 which includes a plurality of sense amplifiers SA. The sense amplifiers SA constitute a page buffer for retaining writing data by sensing reading data. The sense amplifier circuit 2 includes a column selection gate. The row decoder (including a word line driver WDRV) 3 selects and drives the word line WL and the selective gate lines SG1 and SG2.

The input/output buffer 5 receives command data or address data in addition to memory cell data between the sense amplifier circuit 2 and an external input and output terminal. The controller 4 receives an external control signal such as a write enable signal WEn, a read enable signal REn, an address latch enable signal ALE, and a command latch enable signal CLE, and controls an entire memory operation.

Specifically, the controller 4 includes a command interface or an address retention and transfer circuit, and determines whether supplied data is the writing data or the address data. According to a determination result, the writing data is transferred to the sense amplifier circuit 2, and the address data is transferred to the row decoder 3 or the sense amplifier circuit 2. In addition, the controller 4 performs control such as sequence control of a read operation, a write operation, or an erase operation, and applied voltage control, based on the external control signal.

The voltage generation circuit 7 generates a desired pulse voltage based on a control signal from the controller 4. The voltage generation circuit 7 generates various voltages which are required for the write operation, the erase operation, and the read operation.

Figure 2:
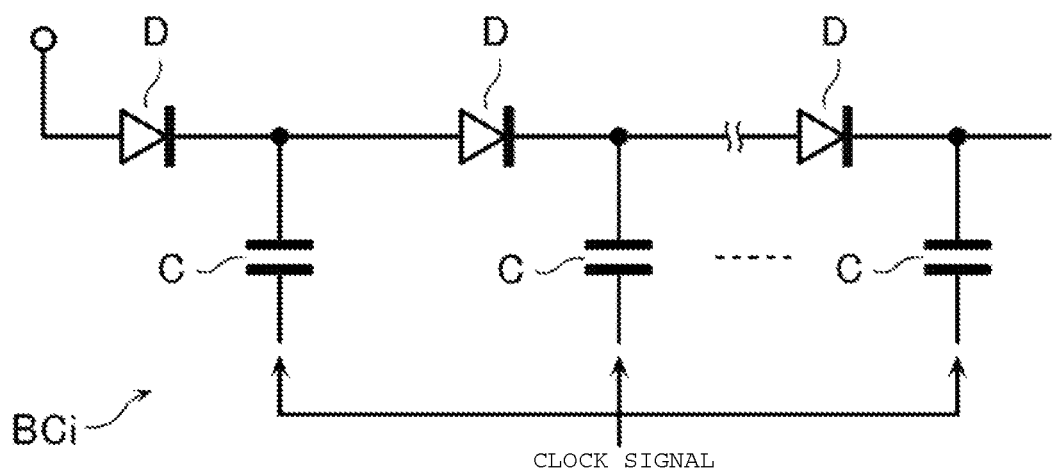
FIG. 2 is a diagram illustrating a configuration of a boosting circuit according to the embodiment.

Here, in the voltage generation circuit 7, a voltage generation circuit 7A which includes a plurality of boosting circuits BC for generating a voltage is provided. The voltage generation circuit 7A generates a voltage which is required for the operation by operating a charge pump provided in the boosting circuit BC. As the charge pump, for example, a configuration as illustrated in FIG. 2 is used. The charge pump is a circuit in which one end of a capacitor C is connected to each stage of serially connected diodes D (transfer transistors), and the other end of the capacitor C is supplied with a clock signal. A potential of the other end of the capacitor C is controlled based on the clock signal, and according to the controlled potential of the other end of the capacitor, the potential of the one end side of the capacitor connected to the diode D increases. The charge pump generates a boost voltage by repeating the potential control operation. The plurality of boosting circuits BC including such a charge pump are serially connected as described below, and constitute the voltage generation circuit 7A, thereby allowing a high voltage to be generated. In addition, in the voltage generation circuit 7, a voltage detecting circuit 7B for detecting an output voltage (Vout) level generated by the boosting circuit BC is provided. Furthermore, the boosting circuit of FIG. 2 illustrates a circuit which configures the diode D by making the transfer transistor to be a diode-connected transistor. In a case of this circuit mode, a voltage to be transferred to the next stage of the diode D (the transfer transistor) is a value (a threshold-subtracted value) which is lowered by a threshold voltage of the transfer transistor. The boosting circuit with a small number of stages is less affected by the subtracted threshold, and such a circuit mode is not suitable for the boosting circuit with a large number of stages. For the boosting circuit with a large number of stages in which the obtained output voltage level is high, a circuit mode in which a voltage level enabling the threshold voltage of the transfer transistor to be cancelled is applied to the gate is general. In this disclosure, the latter circuit mode is adopted, but the former circuit mode which is able to simply illustrate a fundamental mode of the boosting circuit is illustrated in FIG. 2.

Figure 3:
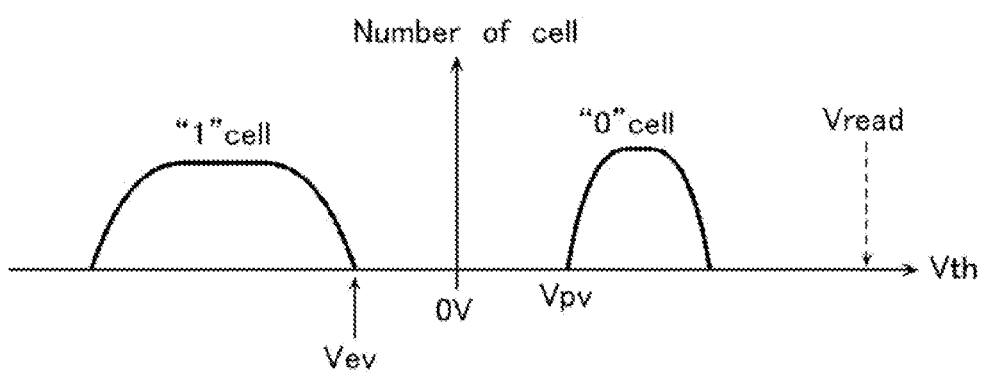
FIG. 3 is a diagram illustrating a relationship of data stored in a memory cell and a threshold voltage.

FIG. 3 is a diagram illustrating a relationship of data stored in the memory cell MC and a threshold voltage. When binary data is stored, a case where the memory cell MC includes a negative threshold voltage is defined as "1" cell retaining logic "1" data, and a case where the memory cell MC includes a positive threshold voltage is defined as "0" cell retaining logic "0" data. An operation for setting the memory cell MC in a "1" data state is the erase operation, and an operation for setting the memory cell MC in a "0" data state is the write operation.

Write Operation

Figure 4:
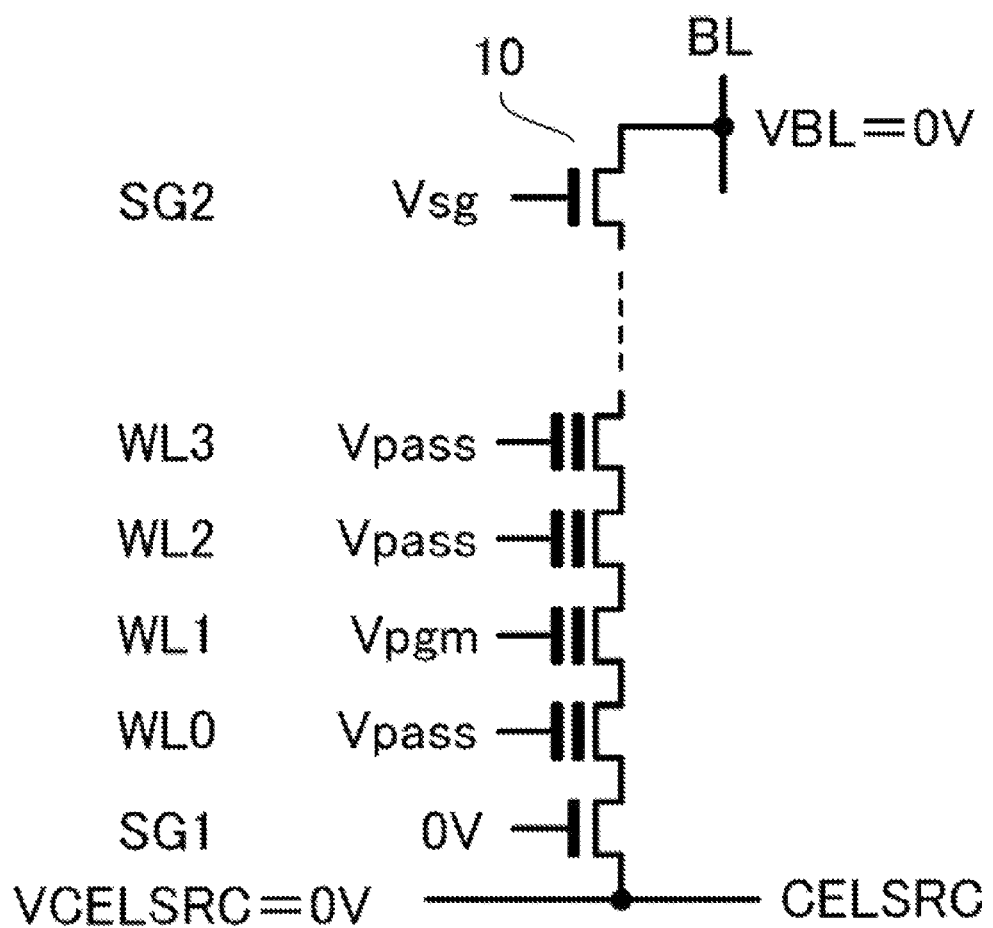
FIG. 4 is a diagram describing a voltage applied to a NAND cell unit when a write operation is performed.

FIG. 4 is a diagram describing a voltage applied to the NAND cell unit 10 when a write operation is performed. The write operation is performed in units of a page. During the write operation, a writing pulse voltage Vpgm (approximately 10 V to 25 V) is applied to the selected word line (WL1) in the selected block BLK. In addition, a middle voltage Vpass (approximately 5 V to 15 V) is applied to the unselected word lines (WL0, WL2, WL3, . . . ), and a voltage Vsg is applied to the selective gate line SG2.

Prior to the write operation, the bit line BL and the NAND cell unit 10 are pre-charged according to the writing data. Specifically, when "0" data is written, 0 V is applied to the bit line BL from the sense amplifier circuit 2. The bit line voltage is transferred to a channel of the memory cell MC connected to the selected word line WL1 through the selective gate transistor S2 and the unselected memory cell MC. Accordingly, under conditions of the write operation described above, an electrical charge is injected to the floating gate electrode from the channel of the selected memory cell MC, and the threshold voltage of the memory cell MC is shifted to a positive side ("0" cell).

When "1" data is written (that is, "0" data is not written in the selected memory cell MC, no writing), a voltage Vdd is applied to the bit line BL. After the bit line voltage Vdd is lowered by a value of the threshold voltage of the selective gate transistor S2 and transferred to the channel of the NAND cell unit, the channel is in a floating state. Therefore, when the writing pulse voltage Vpgm or the middle voltage Vpass described above is applied, the channel voltage increases by a capacitance coupling, and the electrical charge is not injected to the floating gate electrode. Accordingly, the memory cell MC retains "1" data.

Read Operation

Figure 5:
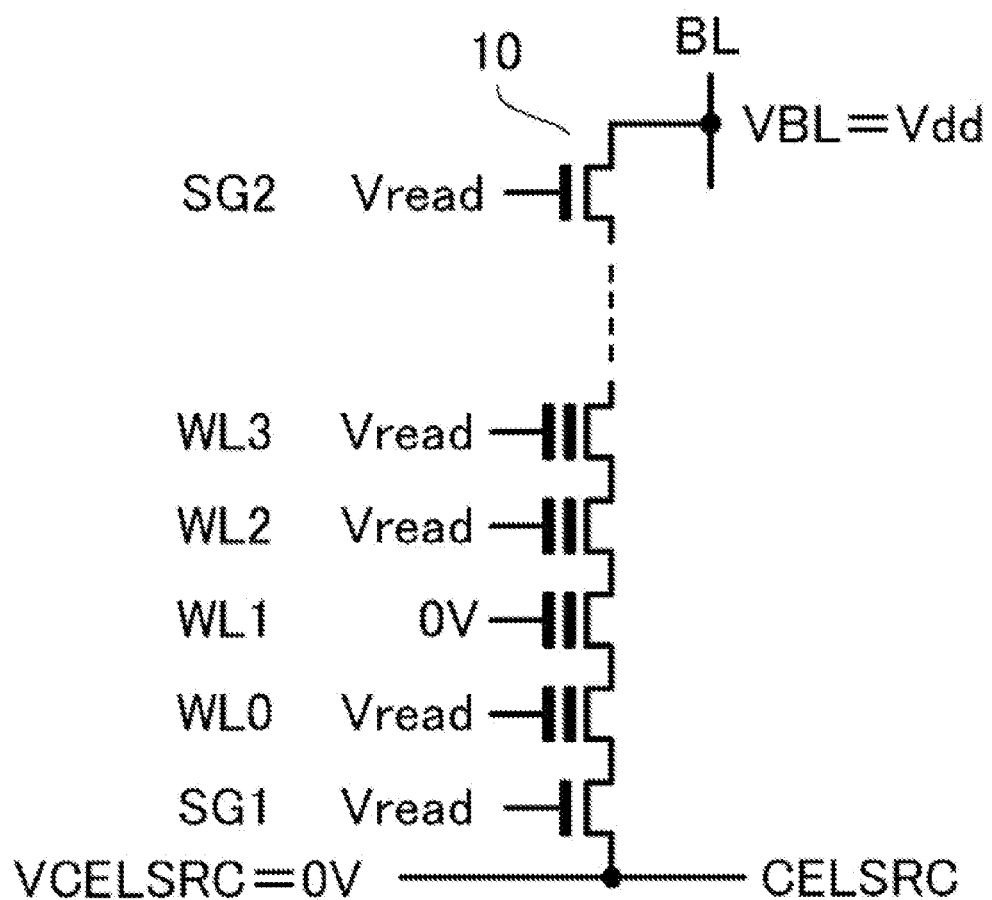
FIG. 5 is a diagram describing a voltage applied to the NAND cell unit when a read operation is performed.

FIG. 5 is a diagram describing a voltage applied to the NAND cell unit 10 when a read operation is performed. The data read operation provides a reading voltage 0 V to the word line WL (the selected word line WL1) to which the selected memory cell MC of the NAND cell unit 10 is connected. In addition, a reading pulse voltage Vread (approximately 3 V to 8 V) is applied to the word lines WL (the unselected word lines WL0, WL2, WL3, . . . ) to which the unselected memory cell MC is connected. At this time, the sense amplifier circuit 2 detects whether or not a current flows through the NAND cell unit 10, and determines the data.

Erase Operation

Figure 6:
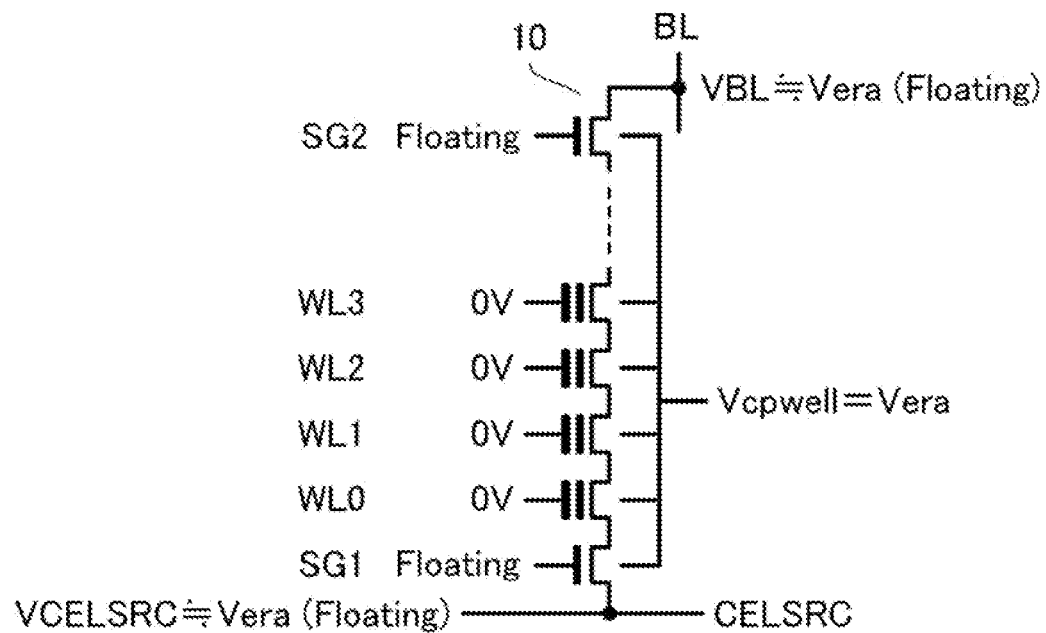
FIG. 6 is a diagram describing a voltage applied to the NAND cell unit when an erase operation is performed.

FIG. 6 is a diagram describing a voltage applied to the NAND cell unit 10 when an erase operation is performed. The erase operation is performed in units of a block. As illustrated in FIG. 6, in the erase operation, an erasing voltage Vera (approximately 10 V to 24 V) is applied to the cell well (CPWELL), and 0 V is applied to the entire word lines WL in the selected block. The electrical charge of the floating gate electrode of each of the memory cells MC is drawn into the cell well side by a FN tunnel current, and the threshold voltage of the memory cell MC decreases. At this time, in order not to break gate oxide films of the selective gate transistors S1 and S2, the selective gate lines SG1 and SG2 are in the floating state. In addition, the bit line BL and the source line CELSRC are also in the floating state.

Figure 7:
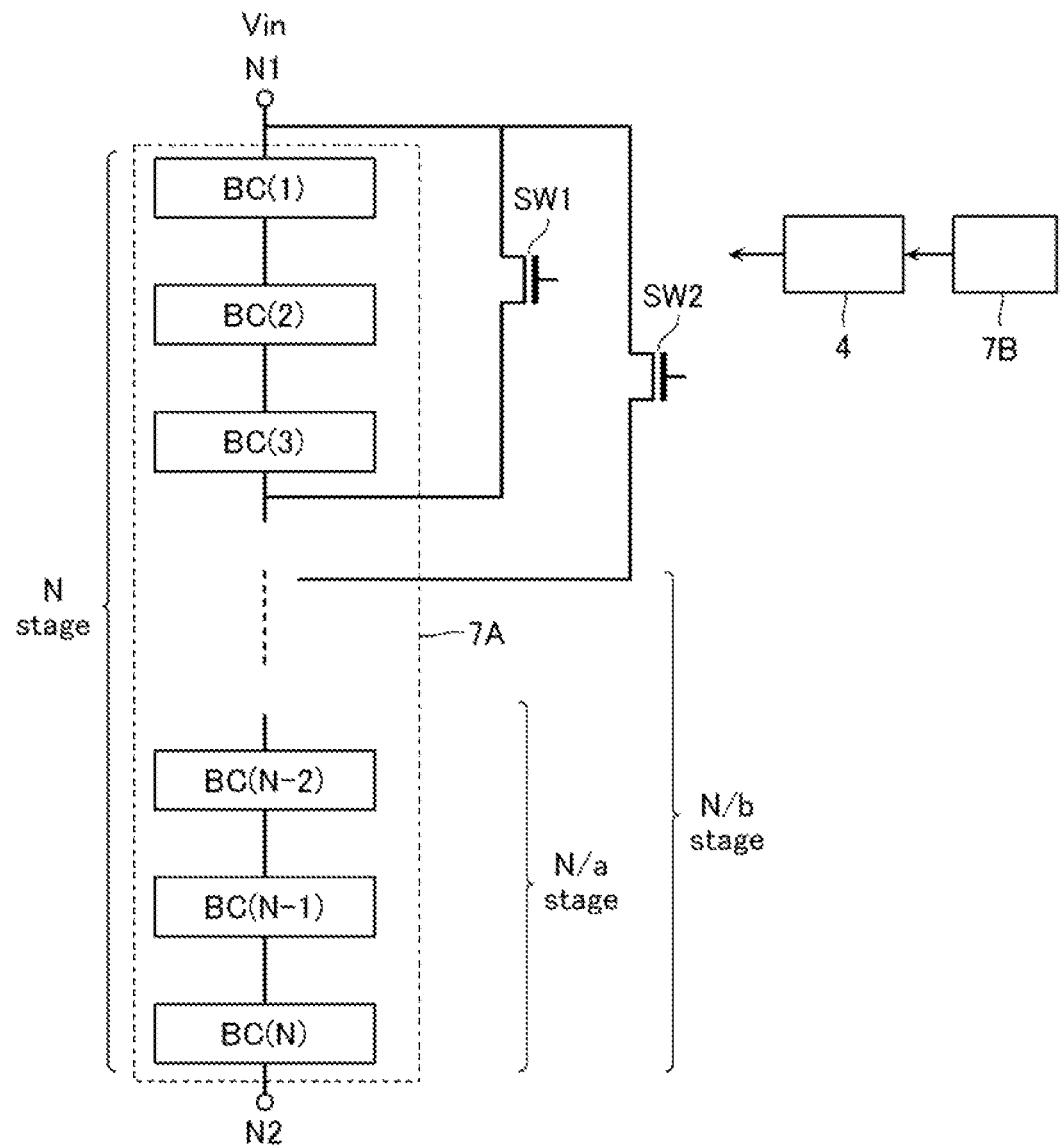
FIG. 7 is a schematic circuit block diagram illustrating a configuration of a voltage generation circuit.

As illustrated in FIG. 7, the voltage generation circuit 7 is provided with a plurality of (for example, N) boosting circuits BC(i) (i=1 to N), and these boosting circuits BC (i) are connected in cascade between an input voltage terminal N1 to which an input voltage Vin is input and an output voltage terminal N2. Since each of the plurality of boosting circuits BC is provided with the ability to boost the voltage, and N boosting circuits BC are connected in cascade, the output voltage Vout can be increased to a value which is approximately proportional to the number N rather than the input voltage Vin.

However, when the input voltage Vin is boosted, there is a problem in which constantly driving the N boosting circuits BC at the same time causes current consumption to be increased and power efficiency to be decreased.

Figure 8:
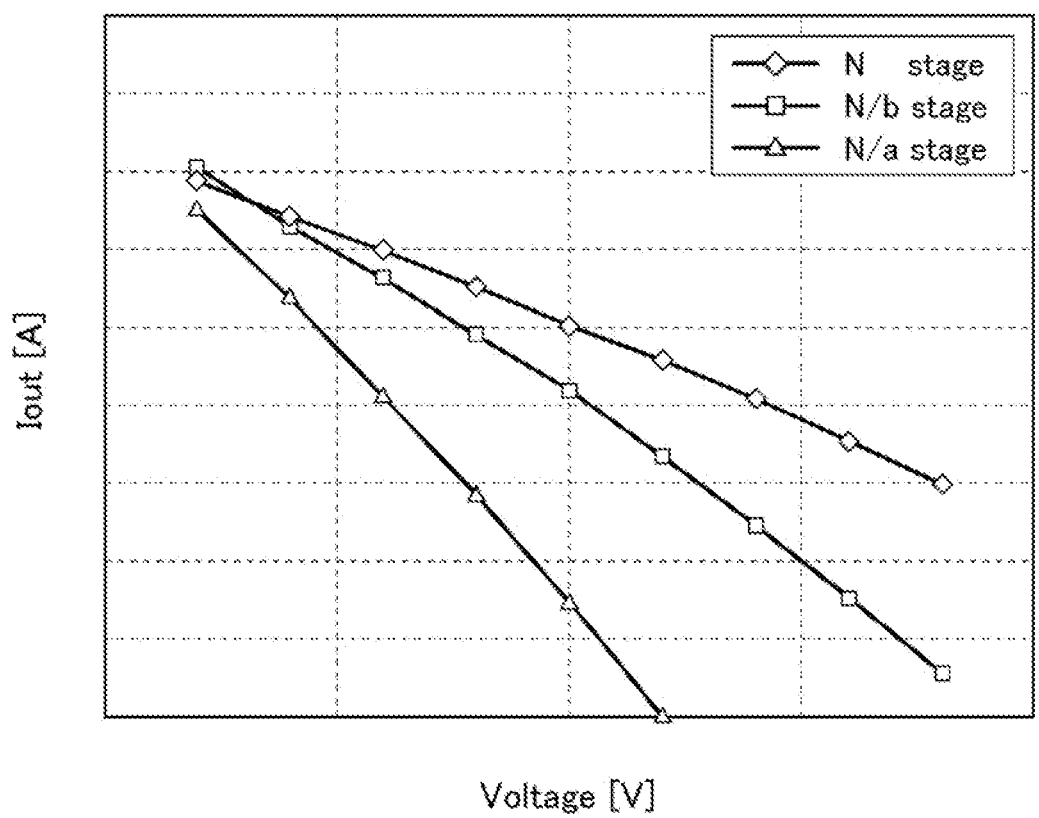
FIG. 8 is a graph illustrating an effect of the present embodiment.

FIG. 8 illustrates a relationship between the number of boosting circuits BC to be connected in cascade and voltage-current characteristics. As the number of boosting circuits BC to be connected in cascade increases, an output current Iout obtained at the same output voltage Vout increases.

Figure 9:
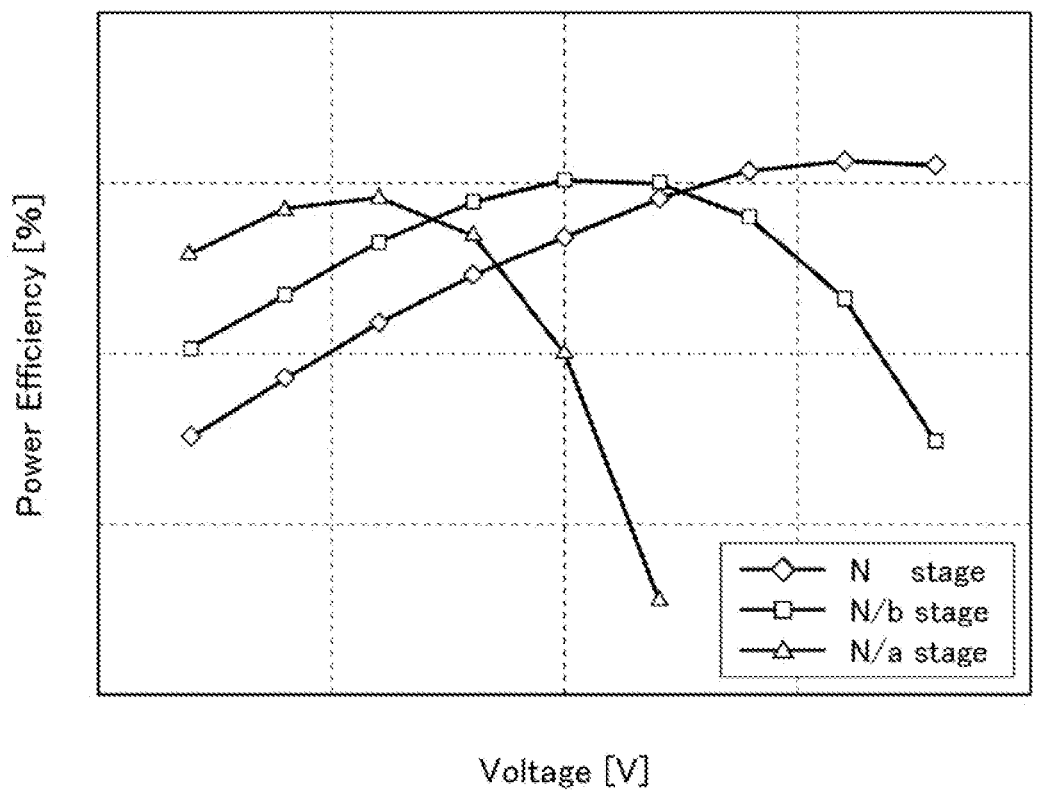
FIG. 9 is a graph illustrating an effect of the present embodiment.

In addition, FIG. 9 illustrates a relationship between the number of boosting circuits BC to be connected in cascade and voltage-power efficiency characteristics. It is found that a value of the output voltage Vout by which maximum power efficiency is obtained is changed according to the number of boosting circuits BC to be connected in cascade.

Therefore, in the voltage generation circuit 7 according to the present embodiment, it is possible to adopt a configuration of increasing the number of boosting circuits BC to be driven within a period in which the output voltage Vout of the output terminal N2 increases. For example, as illustrated in FIG. 7, immediately after starting a boost operation, only N/a boosting circuits BC of the N boosting circuits are driven. As the boost operation proceeds, the number of boosting circuits BC to be driven increases to N/b (b<a), and to N. The N/a boosting circuits BC are N/a boosting circuits BC of the output voltage terminal N2 side, and the N/b boosting circuits BC are N/b boosting circuits BC of the output voltage terminal N2 side.

For this reason, the input voltage terminal N1 is short-circuited from the input terminal of heads of rows of the N/a and the N/b boosting circuits BC to be driven by switching circuits SW (SW1, SW2). When the entire N boosting circuits are driven, the entire switching circuits SW are maintained in a non-conduction state. Furthermore, although FIG. 7 exemplarily illustrates a case where the number of switching circuits SW is 2, the number of switching circuits SW is not limited to 2, and may be equal to 3 or more.

Figure 10:
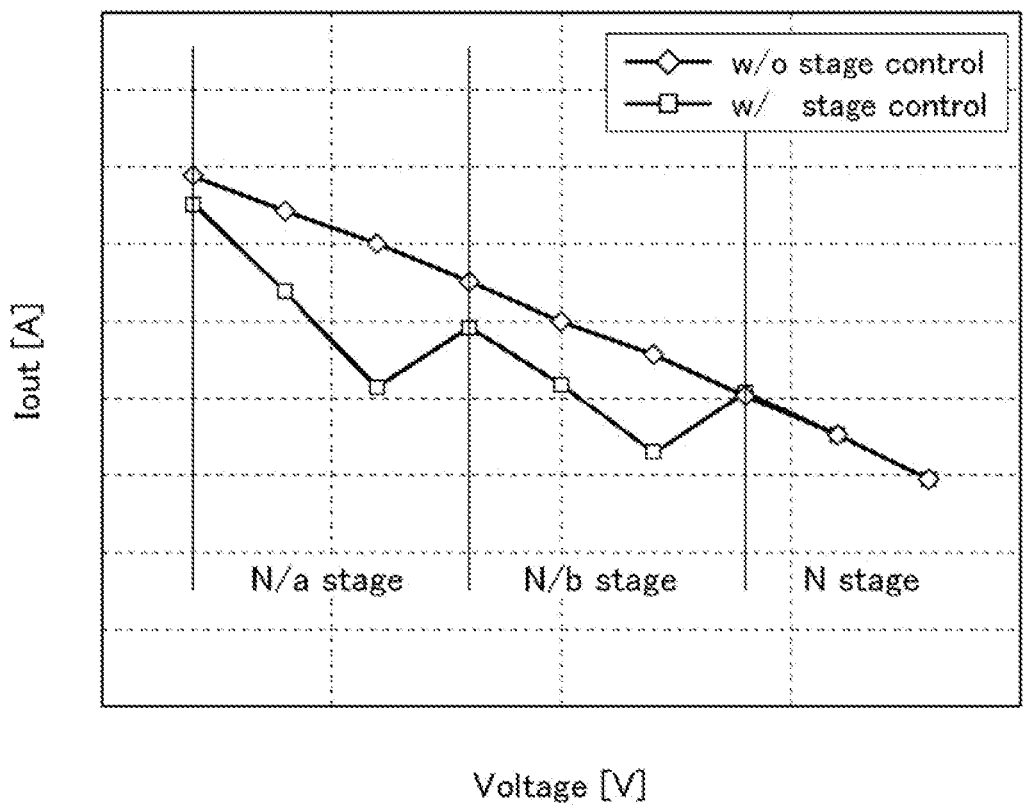
FIG. 10 is a graph illustrating an effect of the present embodiment.
Figure 11:
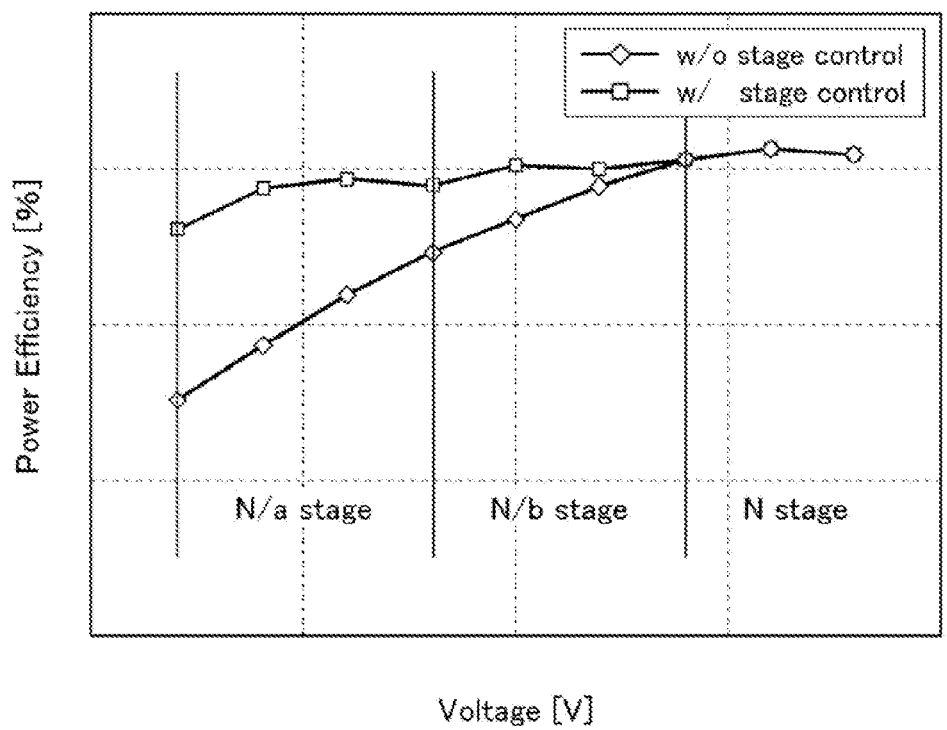
FIG. 11 is a graph illustrating an effect of the present embodiment.

Thus, an effect of a case where the number of boosting circuits BC to be driven gradually increases is described in FIG. 10 and FIG. 11. When the entire N boosting circuits BC are operated immediately after starting the boost operation (w/o stage control), although the high output current Iout is obtained as illustrated in a graph of FIG. 10 in a stage where the output voltage Vout is still low, the power efficiency decreases as illustrated in a graph of FIG. 11.

On the other hand, when the number of boosting circuits BC to be operated gradually increases as in this embodiment (w/ stage control), although the output current Iout slightly decreases as illustrated in the graph of FIG. 10, it is possible to maintain the power efficiency at a high level even in a stage where the output voltage Vout is still low.

Figure 12:
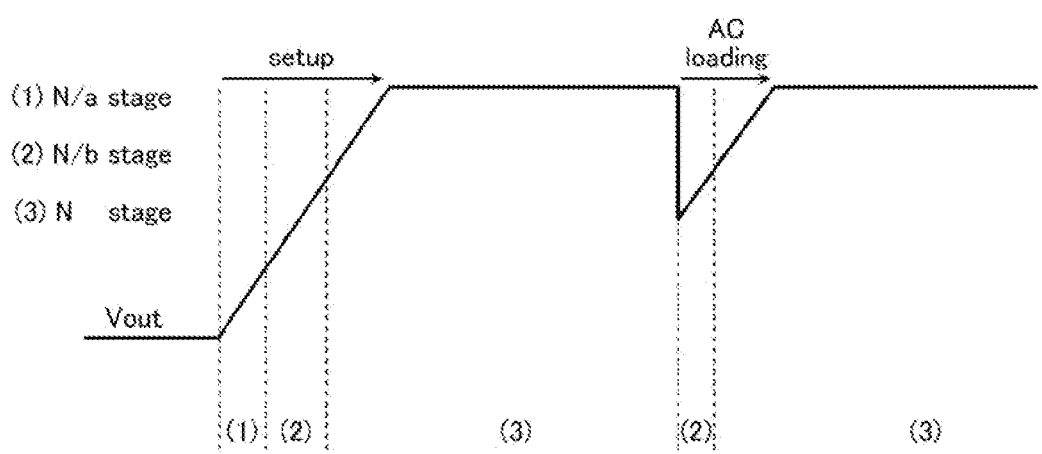
FIG. 12 is a graph illustrating an effect of the present embodiment.

FIG. 12 describes an operational example of the voltage generation circuit 7 when the output voltage Vout is generated. The output voltage Vout of the voltage generation circuit 7 increases to a predetermined voltage, for example, when setup is performed from a reset state. At this time, the entire N boosting circuits BC of the voltage generation circuit 7 are not driven at the same time after starting power activation, but the number of boosting circuits BC to be driven increases, for example, to N/a, to N/b, and to N in a phased manner. Therefore, it is possible to obtain the effect illustrated in FIG. 10 and FIG. 11. In addition, it is possible to perform the same operation not only when the setup is performed but also when various wirings (such as a word line) are charged, for example.

Figure 13:
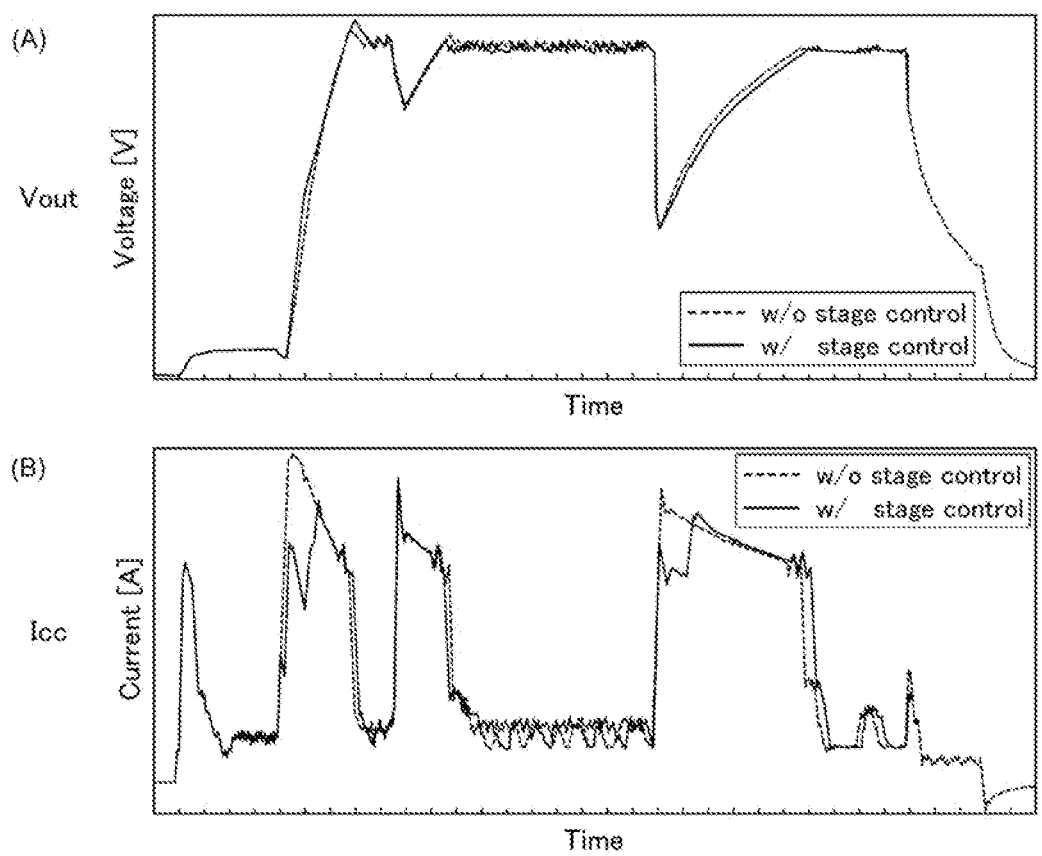
FIG. 13 shows two graphs illustrating an effect of the present embodiment.

FIG. 13 illustrates a temporal transition of the output voltage Vout and current consumption Icc in a practical voltage generation circuit 7. In graph (A) and graph (B) of FIG. 13, a dot-lined graph indicates a case where the N boosting circuits BC are constantly operated, and a solid-lined graph indicates a case where the operation according to this embodiment is performed. Regarding the output voltage Vout, a large change is not observed in both graphs, but regarding the current consumption Icc, it is found that a peak value of the current consumption Icc is restrained by the operation of this embodiment.

Figure 14A:
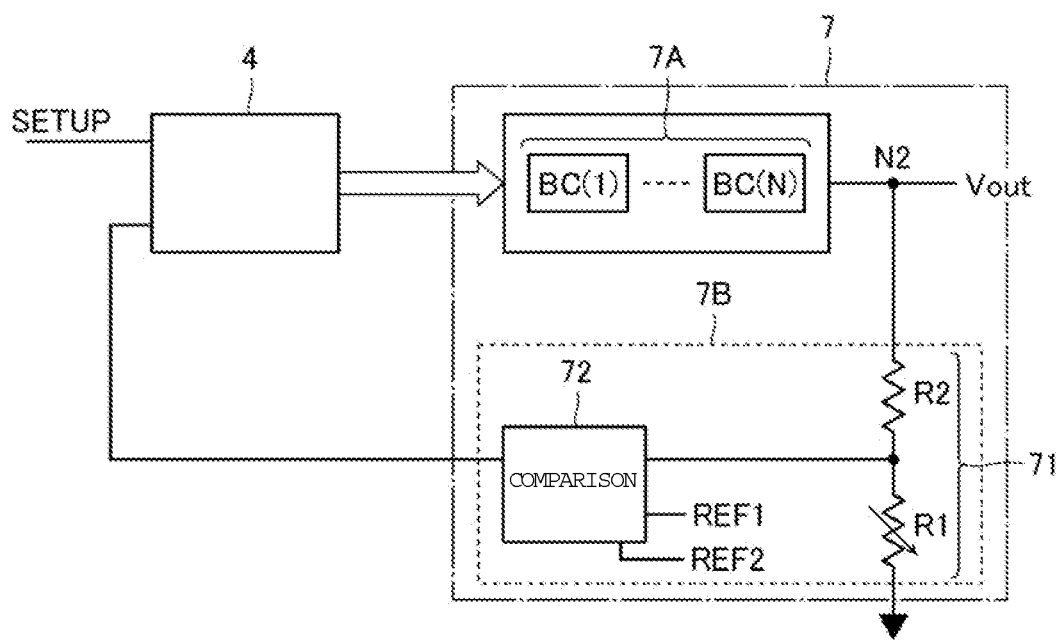
FIG. 14A is a schematic circuit diagram illustrating a configuration of the voltage generation circuit.

In the voltage generation circuit 7, the voltage detecting circuit 7B detects the change of the output voltage Vout of the output voltage terminal N2, for example, as illustrated in FIG. 14A, so that based on a detection result thereof, switch determination and control of the number of boosting circuits BC to be concurrently operated are able to be performed through the controller 4 (the switching circuit SW is not illustrated in FIG. 14A). In an example of FIG. 14A, the voltage detecting circuit 7B includes a voltage-dividing resistor 71 and a comparator 72, and performs the switch control in the controller 4 based on a comparison result of the comparator 72.

Figure 14B:
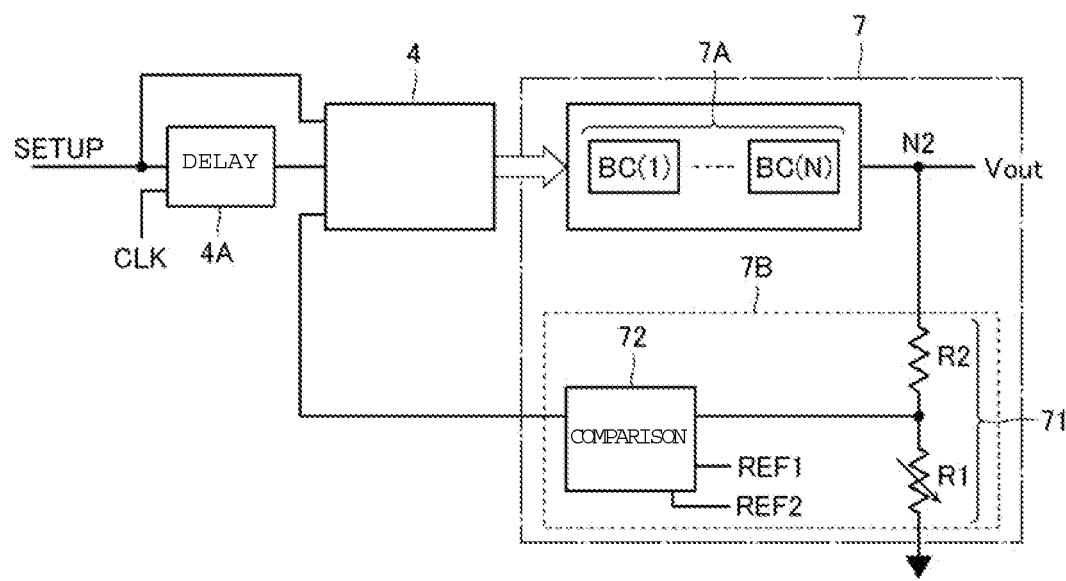
FIG. 14B is a schematic circuit diagram illustrating a configuration of the voltage generation circuit.

In addition, it is possible to perform the switch control described above by measuring a time taken from inputting a predetermined control signal or by delaying the control signal by a delay circuit, in addition to or instead of the detection of the output voltage Vout. FIG. 14B includes a delay circuit 4A in addition to the voltage detecting circuit 7B (the switching circuit SW is not illustrated in FIG. 14B). The delay circuit 4A generates a delay signal SETUP_DLY by delaying a control signal SETUP which indicates the start of the boost operation for a predetermined time according to a clock signal CLK. The control circuit 4 may perform the switch control described above according to the delay signal SETUP_DLY.

Figure 15:
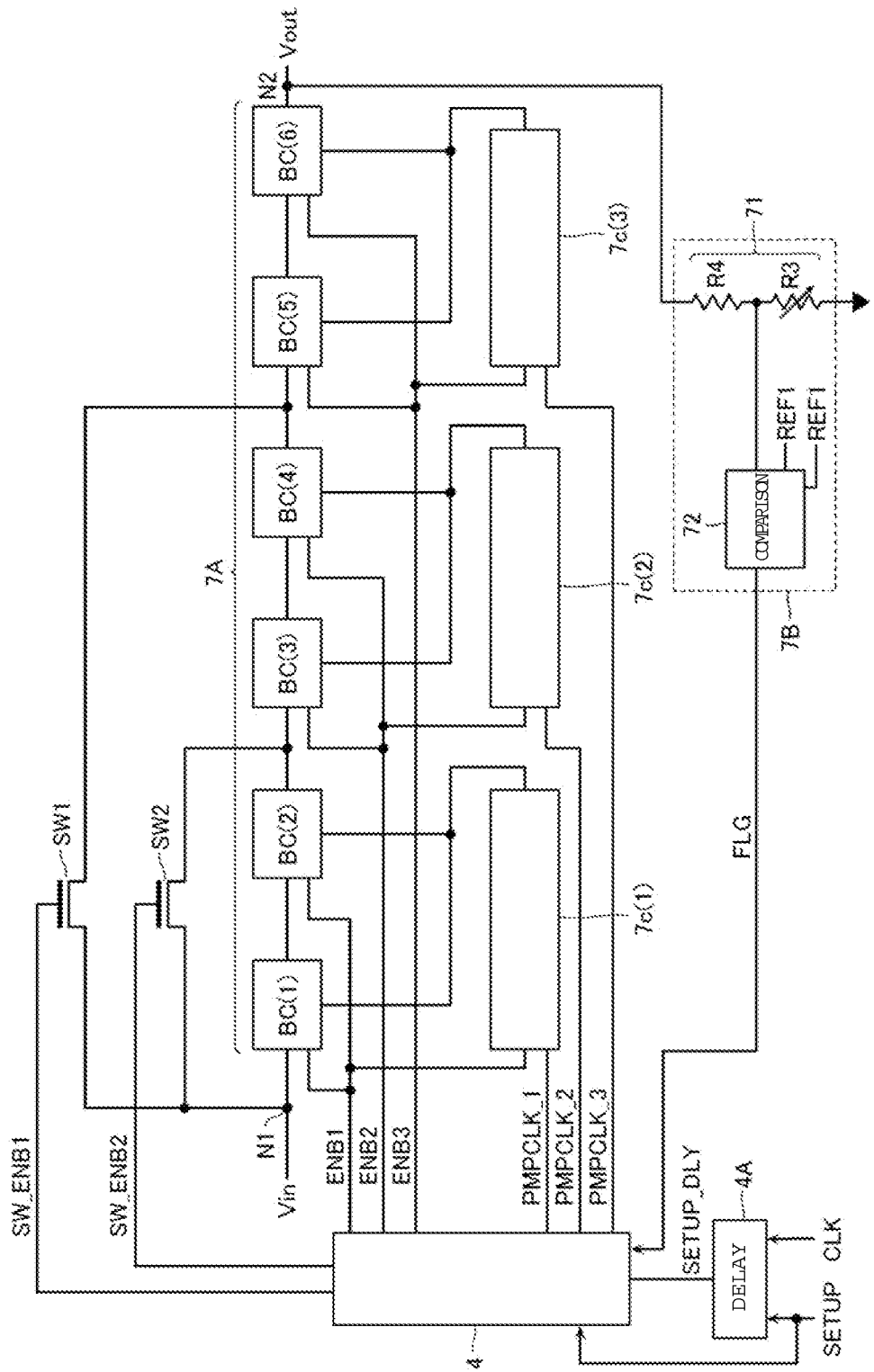
FIG. 15 is a circuit diagram illustrating a specific configuration example of the voltage generation circuit.

FIG. 15 illustrates a specific configuration example of a device including the voltage detecting circuit 7B and the delay circuit 4A as illustrated in FIG. 14B. Here, an example in which the number of boosting circuits BC is 6, and the number of switching circuits SW is 2 (SW1, SW2) is illustrated.

In the configuration example of FIG. 15, as a circuit for driving the boosting circuit BC, drivers 7c(1) to 7c(3) are provided in the voltage generation circuit 7. Here, an example in which the driver 7c(1) drives the boosting circuits BC(1) and BC(2), the driver 7c(2) drives the boosting circuits BC(3) and BC(4), and the driver 7c(3) drives the boosting circuits BC(5) and BC(6) is illustrated. The driver 7c(1) controls the boosting circuits BC(1) and BC(2) according to a clock signal PMPCLK_1 supplied from the control circuit 4, the driver 7c(2) controls the boosting circuits BC(3) and BC(4) according to a clock signal PMPCLK_2 supplied from the control circuit 4, and the driver 7c(3) controls the boosting circuits BC(5) and BC(6) according to a clock signal PMPCLK_3 supplied from the control circuit 4.

Thus, in the embodiment, a configuration in which one driver 7c(i) switches a plurality of (in this example, 2) boosting circuits BC from an inactivated state to an activated state according to an enable signal ENBi is adopted. According to the configuration, it is possible to decrease the number of drivers, and to reduce a circuit area. In this regard, it is possible to adopt a configuration in which one driver 7c(i) controls a single boosting circuit BC.

In addition, the respective boosting circuits BC are activated when the enable signals ENB1 to ENB3 supplied from the control circuit 4 are "H", and the operation starts. The boosting circuits BC(1) and BC(2) receive the enable signal ENB1, the boosting circuits BC(3) and BC(4) receive the enable signal ENB2, and the boosting circuits BC(5) and BC(6) receive the enable signal ENB3.

In addition, the switching circuits SW1 and SW2 are configured to be switched between a conduction state (ON) and a non-conduction state (OFF) by inputting control signals SW_ENB1 and SW_ENB2 from the control circuit 4, respectively.

Figure 16:
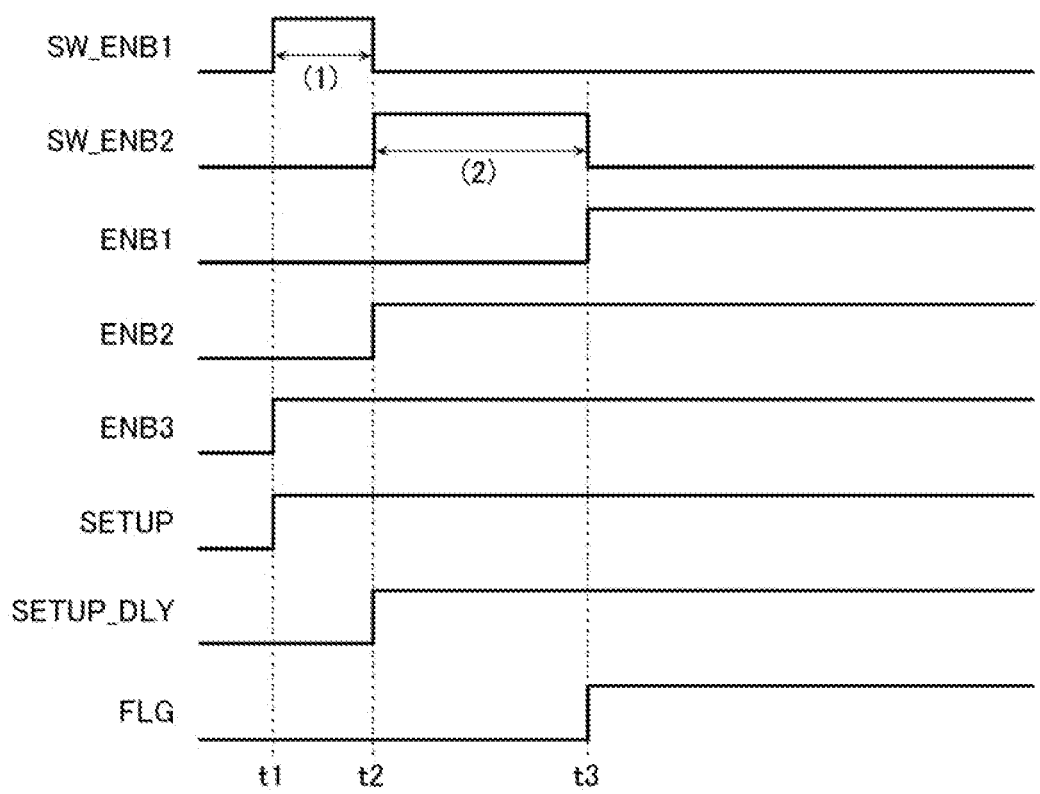
FIG. 16 is a timing chart illustrating an operation of the voltage generation circuit of FIG. 15.

Next, an operational example of a circuit in FIG. 15 will be described with reference to a timing chart in FIG. 16. At time t1, when the control signal SETUP increases to "H", the enable signal ENB3 and the control signal SW_ENB1 also increase to "H" at substantially the same time, so that only the boosting circuits BC(5) and BC(6) are activated, and the other boosting circuits BC(1) to BC(4) are still in the inactivated state. Furthermore, the switching circuit SW1 is switched to the conduction state, so that the activated boosting circuits BC(5) and BC(6) are connected between the input voltage terminal N1 and the output voltage terminal N2.

After that, at time t2, the signal SETUP_DLY in which the control signal SETUP is delayed for a predetermined time by the operation of the delay circuit 4A increases to "H". The control circuit 4 causes the enable signal ENB2 and the control signal SW_ENB2 to increase to "H" by receiving the delay signal, and the control signal SW_ENB1 to be lowered to "L". Therefore, the transition of the boosting circuits BC(3) to BC(6) to the activated state is performed, and the switching circuit SW2 is switched to the conduction state instead of the switching circuit SW1.

After that, at time t3, the comparison circuit 72 detects that the output voltage Vout goes up to a value which is several V smaller than a target value, and a flag signal FLG becomes "H". The control circuit 4 switches the enable signal ENB1 to "H" and the control signal SW_ENB2 to "L" by receiving the flag signal. Therefore, the transition of the entire boosting circuits BC(1) to BC(6) to the activated state is performed, and the switching circuits SW1 and SW2 are concurrently in the non-conduction state. Accordingly, the entire boosting circuits BC(1) to BC(6) are in a state of contributing to the boost operation.

Figure 17:
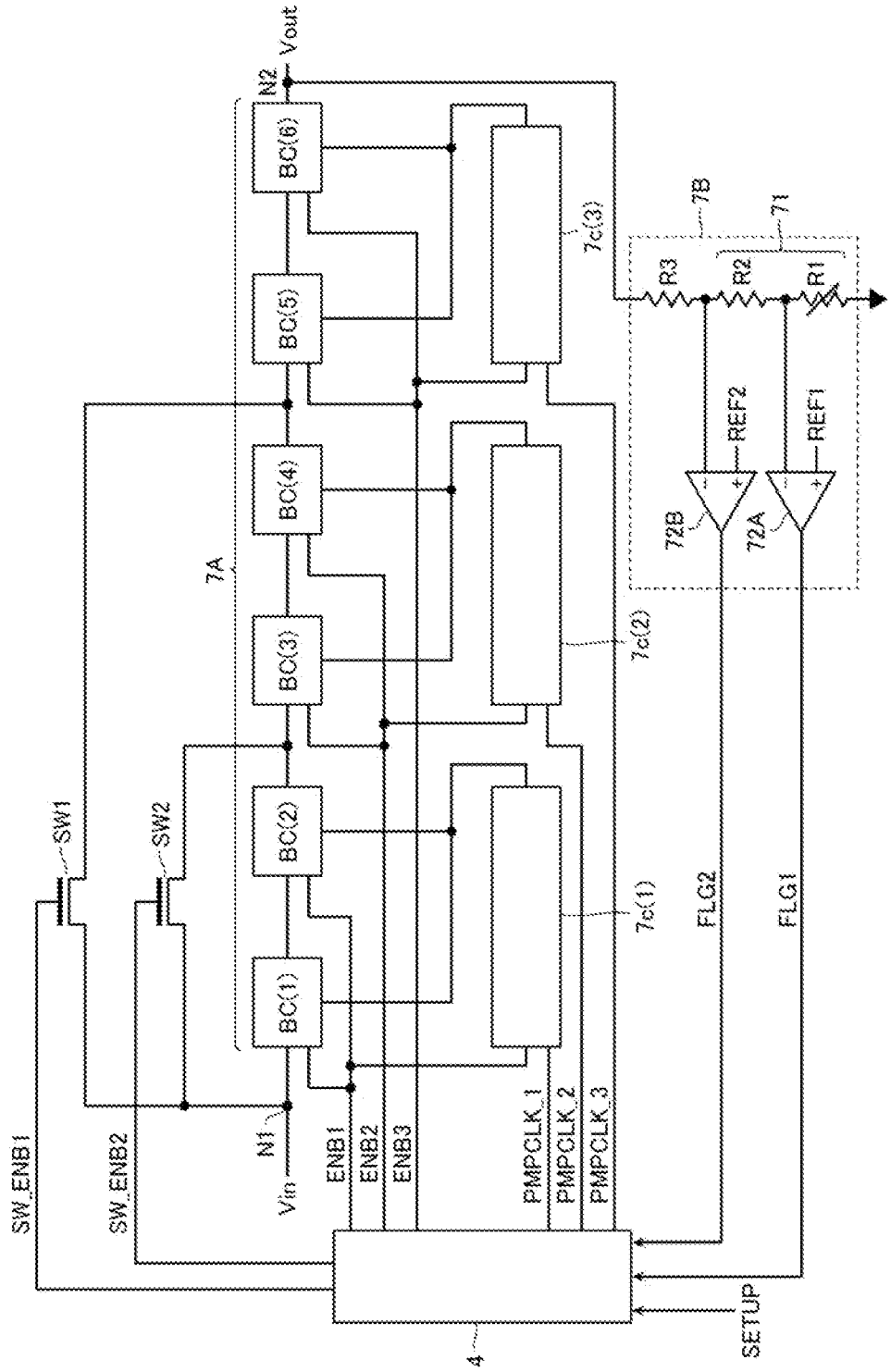
FIG. 17 is a circuit diagram illustrating another specific configuration example of the voltage generation circuit.

FIG. 17 illustrates a specific configuration example of a device including only the voltage detecting circuit 7B without including the delay circuit 4A as illustrated in FIG. 14A. Instead of the delay circuit 4A, the comparison circuit 72 includes 2 comparators 72A and 72B, and outputs 2 types of flag signals FLG1 and FLG2. The control circuit 4 switches logic of the enable signals ENB1 to ENB3 and the control signals SW_ENB1 and SW_ENB2 according to the flag signals FLG1 and FLG2.

Effects

As described above, according to this embodiment, since the number of drives of the plurality of boosting circuits BC increases according to a procedure of the boost operation, it is possible to reduce the peak current of the current consumption in the boosting circuit BC. In addition, at the same time, it is possible to effectively operate the boosting circuit. At this time, the input voltage terminal N1 and the boosting circuit BC during driving are connected by the switching circuit, thereby allowing the output voltage terminal N2 to be constantly fixed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array;
a voltage generation circuit configured to generate a voltage applied to the memory cell array, the voltage generation circuit including a plurality of boosting circuits connected in series between an input terminal and an output terminal, and a switching circuit configured to short-circuit one or more of the boosting circuits to the input terminal; and
a control circuit configured to boost a voltage output from the output terminal at a first slope during a first period and to boost the voltage output from the output terminal at a second slope during a second period, the first slope being different from the second slope.

2. The device according to claim 1, wherein the control circuit is configured to control a conduction state of the switching circuit to vary the number of boosting circuits that are driven to generate the voltage applied to the memory cell array, and the switching circuit includes a first switch connected in parallel to a first group of boosting circuits between the input terminal and a first intermediate node, the first intermediate node being located between the input terminal and the output terminal.

3. The device according to claim 2, wherein the switching circuit includes a second switch connected in parallel to a second group of boosting circuits that includes the first group of boosting circuits between the input terminal and a second intermediate node, the second intermediate node located between the first intermediate node and the output terminal.

4. The device according to claim 1, further comprising:
a voltage detecting circuit configured to detect a voltage level at the output terminal,
wherein the control circuit increases the number of boosting circuits to be driven according to a detection result of the voltage detecting circuit, and
wherein the control circuit is configured to control a conduction state of the switching circuit to vary the number of boosting circuits that are driven to generate the voltage applied to the memory cell array.

5. The device according to claim 4,
wherein the control circuit controls the conduction state of the switching circuit according to the detection result of the voltage detecting circuit.

6. The device according to claim 1, further comprising:
a delay circuit configured to delay an input control signal,
wherein the control circuit increases the number of boosting circuits to be driven based on a signal output from the delay circuit, and
wherein the control circuit is configured to control a conduction state of the switching circuit to vary the number of boosting circuits that are driven to generate the voltage applied to the memory cell array.

7. The device according to claim 6,
wherein the control circuit controls the conduction state of the switching circuit based on the signal output from the delay circuit.

8. A semiconductor memory device comprising:
a memory cell array;
a voltage generation circuit configured to generate a voltage applied to the memory cell array, the voltage generation circuit including a plurality of boosting circuits connected in series between an input terminal and an output terminal, and a plurality of switches, each of which has a first end connected to the input terminal and a second end connected to an intermediate node that is between two of the boosting circuits; and
a control circuit configured to boost a voltage output from the output terminal at a first slope during a first period and to boost the voltage output from the output terminal at a second slope during a second period, the first slope being different from the second slope.

9. The device according to claim 8, wherein one or more of the boosting circuits that are between the intermediate node and the output terminal are driven to generate the voltage applied to the memory cell array regardless of the conduction state of the switches.

10. The device according to claim 8, wherein the control circuit is configured to control a conduction state of the switching circuit to vary the number of boosting circuits that are driven to generate the voltage applied to the memory cell array, and the switches includes a first switch connected in parallel to a first group of boosting circuits between the input terminal and a first intermediate node, the first intermediate node being located between the input terminal and the output terminal.

11. The device according to claim 10, wherein the switches includes a second switch connected in parallel to a second group of boosting circuits that includes the first group of boosting circuits between the input terminal and a second intermediate node, the second intermediate node located between the first intermediate node and the output terminal.

12. The device according to claim 8, further comprising:
a voltage detecting circuit configured to detect a voltage level at the output terminal,
wherein the control circuit increases the number of boosting circuits that are driven according to a detection result of the voltage detecting circuit, and
wherein the control circuit is configured to control a conduction state of the switching circuit to vary the number of boosting circuits that are driven to generate the voltage applied to the memory cell array.

13. The device according to claim 12,
wherein the control circuit controls the conduction state of the switches according to the detection result of the voltage detecting circuit.

14. The device according to claim 8, further comprising:
a delay circuit configured to delay an input control signal,
wherein the control circuit increases the number of boosting circuits that are driven based on a signal output from the delay circuit, and
wherein the control circuit is configured to control a conduction state of the switching circuit to vary the number of boosting circuits that are driven to generate the voltage applied to the memory cell array.

15. The device according to claim 14,
wherein the control circuit controls the conduction state of the switches based on the signal output from the delay circuit.

16. A voltage generation method for a memory cell array of a semiconductor memory device, the method comprising:
driving a first group of boosting circuits connected in series between an input terminal and an output terminal during a first period;
driving a second group of boosting circuits connected in series between the input terminal and the output terminal during a second period after the first period, the second group of boosting circuits including the first group of boosting circuits;
driving a third group of boosting circuits connected in series between the input terminal and the output terminal during a third period after the second period, the third group of boosting circuits including the first and second groups of boosting circuits, and
boosting a voltage output from the output terminal at a first slope during the first period and boosting the voltage output from the output terminal at a second slope during a second period, the first slope being different from the second slope,
wherein one or more of the boosting circuits is coupled to a switching circuit that is configured to short-circuit the one or more of the boosting circuits to the input terminal.

17. The method according to claim 16, wherein the first group of boosting circuits is driven in response to an input control signal.

18. The method according to claim 17, further comprising:
detecting a voltage level at the output terminal, and
controlling a conduction state of the switching circuit to vary the number of boosting circuits that are driven to generate the voltage applied to the memory cell array,
wherein the second group of boosting circuits is driven when the voltage level is greater than a first voltage level, and the third group of boosting circuits is driven when the voltage level is greater than a second voltage level that is higher than the first voltage level.

19. The method according to claim 17, further comprising:
delaying the input control signal, and
controlling a conduction state of a switching circuit to vary the number of boosting circuits that are driven to generate the voltage applied to the memory cell array,
wherein the second group of boosting circuits is driven based on the delayed input control signal.

20. The method according to claim 16, further comprising:
detecting a voltage level at the output terminal,
wherein the third group of boosting circuits is driven when the voltage level reaches a predetermined voltage level.

* * * * *